April 20, 1954 J. F. LAIDIG 2,676,258

HARMONIC CRYSTAL OSCILLATOR

Filed July 20, 1949 2 Sheets-Sheet 1

INVENTOR
J. F. LAIDIG
BY W. J. O'Neill
ATTORNEY

INVENTOR
J. F. LAIDIG
BY W. J. O'Neill
ATTORNEY

Patented Apr. 20, 1954

2,676,258

UNITED STATES PATENT OFFICE 2,676,258

HARMONIC CRYSTAL OSCILLATOR

John F. Laidig, Mine Hill, N. J., assignor to Bell Telephone Laboratories, Incorporated, New York, N. Y., a corporation of New York Application July 20, 1949, Serial No. 105,741

17 Claims. (Cl. 250—36)

This invention relates to crystal controlled oscillation generators, and particularly to harmonic crystal type oscillators which may be utilized for producing high frequency currents controlled by a mechanical harmonic or overtone mode frequency of one or more piezoelectric crystal bodies operating in a frequency spectrum which may be of the order of up to 50 megacycles or more per second.

One of the objects of this invention is to provide a harmonic crystal oscillator capable of producing oscillations at a mechanical harmonic mode frequency of one or more associated piezoelectric crystal bodies, without interference from the fundamental or a lower mode frequency of such crystal body or bodies.

Another object of this invention is to improve the frequency stability of harmonic crystal oscillators.

Another object of this invention is to provide low current drain on the power supply source for harmonic crystal oscillators.

Another object of this invention is to reduce parasitic oscillations in harmonic crystal oscillators.

Another object of this invention is to reduce the number of circuit components in oscillators operating at mechanical harmonic mode frequencies of a plurality of piezoelectric crystal elements.

A particular object of this invention is to provide a circuit impedance arrangement presenting a high impedance to the undesired fundamental mode frequency or frequencies of the associated piezoelectric crystal elements and, at the same time, a low impedance to the desired harmonic mode frequency or frequencies, such as the third, fifth or other mechanical harmonic mode frequency or frequencies thereof.

Another particular object of this invention is to provide a harmonic crystal oscillator circuit capable of operation over a wider range of harmonic mode frequencies corresponding to the several harmonic mode frequencies of a series or plurality of different frequency harmonic mode piezoelectric crystal bodies.

In oscillatory piezoelectric crystal elements of the high frequency type, it has been difficult heretofore to utilize in practical systems the higher order mechanical harmonics of crystal elements. In accordance with this invention, such mechanical harmonics of crystal elements may be made use of, and circuits provided which enable the crystal elements to oscillate efficiently at high frequencies which may be values up to the order of 50 or more megacycles per second.

For precision control of the frequency of an oscillation generator, it is desirable to utilize a piezoelectric crystal body because of its inherently high frequency stability, and where the frequency desired is higher than that which may be obtained conveniently from the fundamental or lower natural frequency mode of vibration of the piezoelectric body, one or more of the mechanical harmonic or overtone mode frequencies thereof, which have a higher frequency than the fundamental mode frequency, may be utilized for accurate frequency control purposes in a suitable circuit.

A piezoelectric crystal body, such as a known thin AT-cut quartz crystal plate or disc adapted to operate in thickness mode vibrations of the shear type, will exhibit mechanical, and also electrical, resonance at odd harmonics of its fundamental thickness mode frequency, and accordingly may be excited at any selected one of its mechanical harmonic mode frequencies by means of a suitable circuit; and in the case of the known AT-cut quartz crystal plate referred to, the harmonic mode frequency may be nearly an exact third, fifth, seventh or other odd order overtone of the fundamental mode frequency thereof and thereby provide a stable harmonic crystal body oscillating on its harmonic mode frequency for direct and accurate working frequency control purposes at a comparatively high crystal vibrator frequency which may conveniently be a value up to 50 megacycles per second, or a considerably higher value.

It will be understood that the harmonic mode vibration of the crystal element itself, rather than the fundamental mode frequency thereof, is of particular interest in order to obtain a high frequency crystal control of the circuit frequency. For this purpose, the mechanical harmonic of the crystal element may be an odd order harmonic of the fundamental shear mode thickness vibration in an AT-cut or BT-cut quartz crystal element, for example. Accordingly, with such a suitable type of harmonic crystal unit or units, the circuits provided in accordance with this invention make commercially available an upwardly extended frequency range of reliable crystal controlled operation.

In accordance with this invention, a harmonic crystal oscillator circuit is provided which may be controlled in frequency by the harmonic mode frequency of the associated harmonic crystal body, or of a plurality of such crystal bodies working at selected spaced points over a desired range of harmonic mode frequencies; and in accordance with a feature of this invention, a frequency discriminator means may be employed in the associated circuit to discriminate against the undesired fundamental mode frequency of the harmonic crystal body or bodies, and at the same time permit the circuit to oscillate only on the desired harmonic mode frequency of the crystal body or bodies.

The oscillator circuit may include a suitable electronic tube such as a pentode designed for high frequency use and having the usual cathode, control grid, screen grid, suppressor grid and anode or plate electrodes, and provided with the usual power supply sources for heating the cathode heater and for supplying suitable positive potentials to the screen grid and plate electrodes of the oscillator tube. Associated with the oscillating electrodes of the oscillator tube, which may be the cathode, control grid and plate electrodes, a bridge circuit may be provided one of whose elements is a suitable piezoelectric crystal unit so disposed that the bridge is balanced at all frequencies except the series resonant frequencies of the crystal body and no plate-to-control grid feedback occurs except at those series resonant frequencies of the crystal body.

In a particular embodiment, the harmonic crystal oscillator circuit provided in accordance with this invention may comprise a grounded cathode single oscillator tube of the pentode type acting as a source of high gain, a frequency determining bridge system which may be connected in circuit with the plate, control grid and grounded cathode electrodes of the pentode type oscillator tube and which may comprise a tunable circuit tuned approximately to the desired frequency of oscillation disposed in two of the bridge arms and provided with a capacitance divider having the tap therebetween connected with the grounded cathode electrode of the oscillator tube, a frequency controlling harmonic crystal body disposed in another bridge arm and operating at its series resonance harmonic frequency, a neutralizing or balancing capacitor disposed in the remaining bridge arm and connected in the control grid-to-plate circuit of the oscillator tube for neutralizing or balancing the capacitance across the crystal body and the stray capacitance associated with the crystal holder, suitable means for effectively attenuating the undesired fundamental mode frequency of the crystal body or bodies while simultaneously transmitting the desired harmonic mode frequency thereof, and an output circuit for taking off from the oscillator circuit the desired harmonic mode frequency or frequencies.

One of the objectives in a high frequency harmonic crystal oscillator, as for example when it is to be used in mobile or other isolated applications, may be a need for a lower current drain on the power supply source used therewith. This objective may be attained by utilizing a single vacuum tube for the source of gain. Also, another objective is to reduce the possibility of parasitic oscillations in the circuit and for this purpose the use of the capacitance tap on the capacitance dividing capacitors associated with the harmonic crystal oscillator tank circuit reduces the possibility of parasitic oscillations, since the oscillator tube capacitance and other stray capacitances are then paralleled mainly with the tank capacitors referred to, rather than with parts of the tank circuit inductance element.

Another point of interest noted is that, to prevent the circuit from oscillating at frequencies other than a series resonant frequency of the piezoelectric crystal body, the capacitance divider formed by the capacitors from the grid electrode of the tube to the two ends of the tank circuit may divide the voltage in the same ratio as the capacitance divider formed by the capacitors from the cathode electrode of the tube to the two ends of the tank circuit. The capacitance between the grid electrode and the plate end of the tuned circuit comprises the control grid-to-plate capacitance plus the associated stray capacitance of the oscillator tube connections plus the neutralizing or balancing capacitor. Inasmuch as the control grid-to-plate capacitance and the associated stray capacitance of the oscillator tube connections are small compared to the required capacitance, a neutralizing cpacitance which is large relative to the stray capacitances is required to balance the circuit. Thus, the effect of the oscillator tube on the oscillation frequency is greatly decreased. Moreover, in the circuit here utilized, since the capacitance of the crystal unit as measured from ground to the control grid side of the crystal unit does not tend to prevent the circuit from oscillating, any suitable harmonic crystal may be utilized that has a reasonably low capacitance across the crystal itself.

Another point of advantage noted is that the cathode of the oscillator tube being grounded, the use of a tube of the pentode type is thereby facilitated, and moreover the use of the pentode type of vacuum tube results in an increase in the gain and also in an increase in the plate resistance for the oscillator tube, and also in a decrease in the control grid-to-plate capacitance thereof and hence a decrease in its effect upon the oscillator circuit frequency.

In order to prevent oscillation of the circuit as a grid-plate oscillator at the undesired fundamental mode frequency of the piezoelectric crystal element, a small discriminator capacitor may be added in circuit between the plate electrode of the oscillator tube and the plate end of the tuned circuit. This discriminator capacitor is adapted to present a high impedance at the fundamental mode frequency of the piezoelectric crystal element thus decoupling the plate circuit of the oscillator tube from the tuned circuit at that frequency and thereby preventing circuit oscillations at that undesired fundamental mode frequency. At the same time, this discriminator capacitor is adapted to present a much lower impedance at the higher harmonic mode operating or working frequency of the piezoelectric crystal element thus coupling the plate circuit of the oscillator tube to the tuned circuit at that harmonic mode frequency and thereby transmitting and permitting circuit oscillations at that desired harmonic mode frequency. Such a discriminator capacitor is especially convenient when the oscillator must be capable of operating over a relatively wide range of frequencies, since the discriminator capacitor provides a substantial margin of frequency discrimination between the desired harmonic and the undesired fundamental mode frequencies. The circuit may thereby be made to operate over a somewhat wider range of desired harmonic mode frequencies by the use of the discriminator capacitor method referred to, than by the use of other simple expedients to prevent oscillations at the undesired fundamental mode frequency.

In order to obtain a wide tuning range, as for example, to suit the range of harmonic mode frequencies that may be provided by individually utilizing in the circuit a plurality of separate harmonic mode crystal bodies of widely different frequencies, the tank circuit of the oscillator may be tuned by adjustment of a variable capacitance element thereof, instead of by adjustment of the variable inductance element thereof. The tank circuit referred to may comprise a parallel-connected tuning capacitor and inductance winding.

Where a plurality of harmonic mode crystals of different frequencies are utilized to cover a desired relatively narrow range of frequencies, the tank circuit of the oscillator need not be separately tuned to each operating frequency and accordingly multifrequency operation of the oscillator may be provided by utilizing a suitable selector type of switching arrangement to switch any one of the several harmonic crystals, one at a time, into or out of the oscillator circuit. The switching arrangement may be of the known turret type, or may be a remotely-operated arrangement utilizing suitable relays. The switches and crystals may be placed relatively close to the oscillator tube in order to keep stray shunt capacitances in the circuit as low as possible.

The desired harmonic mode frequency or frequencies may be taken off from an output circuit having one terminal connected with the grounded cathode electrode of the oscillator tube and having the other terminal connected at a suitable point, as with an adjustable tap on the inductance winding of the tuned tank circuit.

Should it be desired to obtain a still higher output frequency than may be conveniently obtained directly from the oscillator circuit producing the frequency corresponding to the harmonic mode frequency of the piezoelectric body, an odd or even order electrical overtone such as the second or third order electrical harmonic overtone of the crystal mechanical harmonic mode frequency may be taken from the oscillator by a suitable output circuit. In such an arrangement, a tuned circuit provided in the output or plate circuit of the oscillator tube may be tuned to a frequency $nf$ where $n$ is a value 1, 2, 3, etc., and where $f$ is the operating or working mechanical harmonic mode frequency of the piezoelectric crystal body.

For a clearer understanding of the nature of this invention and the additional advantages, features and objects thereof, reference is made to the following description taken in connection with the accompanying drawing, in which like reference characters represent like or similar parts and in which.

Figure 1:
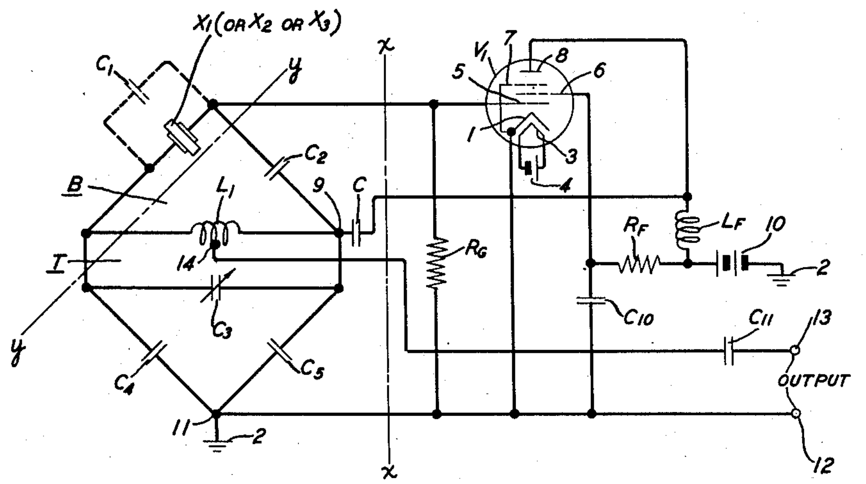
Fig. 1 is a circuit diagram illustrating schematically a bridge type harmonic crystal oscillator apparatus in accordance with this invention.
Figure 1A:
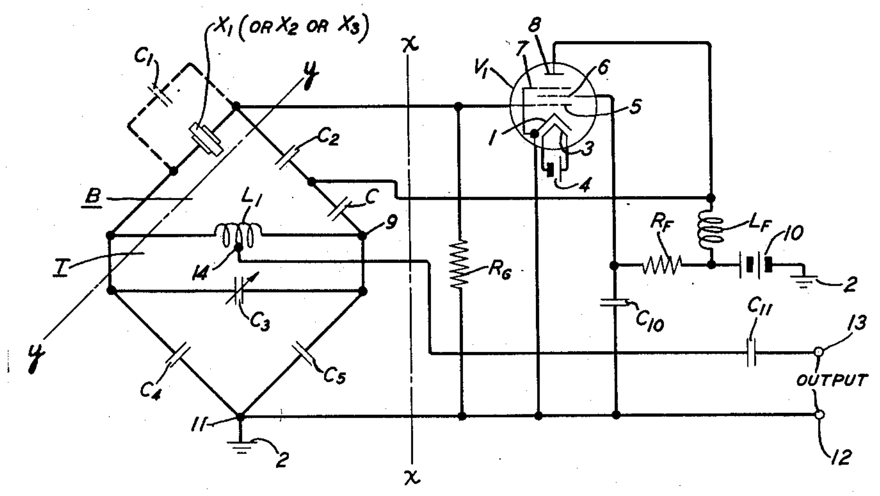
Fig. 1A is a circuit diagram illustrating a modification of the oscillator circuit of Fig. 1, in which the neutralizing capacitor is placed directly across the control grid and plate electrodes of the oscillator tube.
Figure 2:
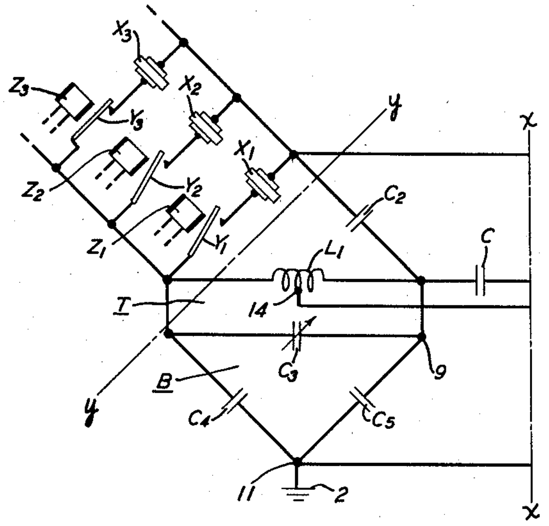
Figure 3:
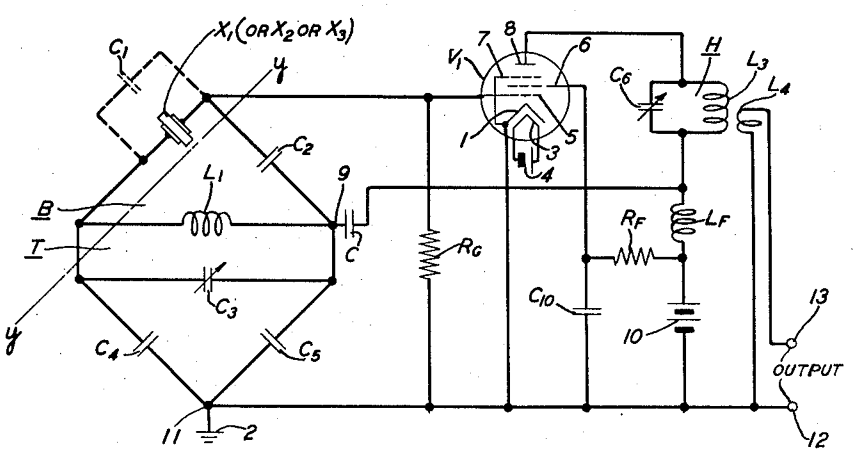

Fig. 2 is a circuit diagram illustrating particularly at the left side of broken line $y$—$y$, a series of different frequency harmonic mode crystals which may be used in the bridge arm of Figs. 1, 1A, and 3, and also illustrating the circuit of Fig. 1 at both the left and right sides of the broken line $x$—$x$; and Fig. 3 is a circuit diagram illustrating a modification of the oscillator circuit of Fig. 1, in which an electrical harmonic or overtone of the operating mechanical harmonic mode frequency of the crystal oscillator is taken from the output.

Referring to the drawing, Fig. 1 is a circuit diagram illustrating a harmonic crystal oscillator circuit comprising generally an amplifier or source of high gain $V_1$, a bridge circuit B, a tuned tank circuit T, and an output circuit at 12 and 13 for taking off the harmonic mode crystal oscillations as provided by any of a plurality of different frequency harmonic mode crystals $X_1$, $X_2$, $X_3$, etc.

As shown in Fig. 1, the amplifier source of gain $V_1$ may be in the form of a single pentode type vacuum tube electronic gain device $V_1$ having a grounded cathode electrode 1 connected to ground 2 and heated by a suitable cathode heater 3 which may be energized by a suitable battery or other power supply source 4, an input or control grid electrode 5 which may be connected through a suitable grid leak resistor $R_G$ to the grounded cathode electrode 1, a screen grid electrode 6 which may be connected through a suitable bypass capacitor $C_{10}$ to the grounded cathode electrode 1, a suppressor grid electrode 7 which may be connected with the grounded cathode electrode 1, and an anode or plate electrode 8 which, together with the cathode and control grid electrodes 1 and 5 may constitute the oscillation generating electrodes of the vacuum tube $V_1$. As shown in Fig. 1, the anode electrode 8 may be energized with a suitable positive potential, through a suitable radio frequency choke coil $L_F$, by means of a suitable battery or other power supply source 10 having its negative terminal connected to ground 2 and to the grounded cathode electrode 1. Similarly, the screen electrode 6 may be energized with a suitable positive potential through a filter resistor $R_F$ connected with the positive terminal of the power supply source 10. While particular forms for energizing the vacuum tube $V_1$ have been illustrated, it will be understood that any suitable means may be utilized.

As illustrated in the drawing, a frequency controlling bridge system B may be connected with the grounded cathode electrode 1, the control grid electrode 5 and the plate or anode electrode 8 of the vacuum tube $V_1$. A tank circuit T comprising a parallel connected inductance winding $L_1$, a variable capacitor $C_3$ and voltage divider capacitors $C_4$ and $C_5$ is tuned approximately to the desired oscillation frequency and is disposed in relation to two adjacent arms of the bridge B. The tap connection 11 between the voltage divider capacitors $C_4$ and $C_5$ may be connected with the grounded cathode electrode 1 of the vacuum tube $V_1$. A series resonant harmonic crystal body $X_1$ or $X_2$ or $X_3$, etc., may be individually disposed in a third arm of the bridge B and may be connected in circuit between the control grid electrode 5 of vacuum tube $V_1$ and one end of the tank circuit T as shown in the drawing. In the fourth arm of the bridge B, a neutralizing or balancing capacitor $C_2$ may be provided and connected between the control grid electrode 5 of the vacuum tube $V_1$ and the plate end of the tank circuit at 9, in order to neutralize or balance out the stray capacitance $C_1$ across the crystal body $X_1$ or $X_2$ or $X_3$, etc. Between the plate electrode 8 of the vacuum tube $V_1$ and the plate end 9 of the tank circuit T, a discriminator capacitor C may be added. Output circuit oscillations corresponding to the desired crystal harmonic mode frequency may be taken from the circuit at output terminals 12 and 13, the terminal 12 being connected with the grounded cathode electrode 1 of the vacuum tube $V_1$, and the terminal 13 being connected through a coupling capacitor $C_{11}$ to a tap 14 provided on the inductance winding $L_1$ of the tunable tank circuit T, the position of the tap 14 on the coil $L_1$ being adjusted for proper impedance match to the output circuit.

The harmonic crystal body $X_1$, $X_2$ or $X_3$, etc., may be any suitable piezoelectric harmonic crystal body adapted to operate and work at a mechanical harmonic mode overtone frequency of its fundamental mode frequency. For this purpose a thickness-shear mode AT-cut or BT-cut quartz crystal element, operating and working at an odd order overtone mechanical harmonic of its fundamental thickness mode of motion, may be conveniently utilized, and the desired harmonic mode frequency thereof may be the third, fifth, seventh, or other odd order harmonic mode frequency thereof corresponding to the frequency desired for the circuit oscillations. Examples of such harmonic AT-cut or BT-cut quartz crystals, with mountings and holders therefor to form a harmonic crystal unit, are disclosed in United States Patents No. 2,218,200, issued October 15, 1940 to Lack, Willard and Fair, and No. 2,453,435, issued November 9, 1948 to H. Havstad; and in applications Serial No. 623,150, filed October 18, 1945 by L. J. La Brie, now Patent No. 2,486,482 dated November 1, 1949, and Serial No. 26,013, filed May 10, 1948 by F. Caroselli, now Patent No. 2,509,478, dated May 30, 1950. While the present invention is described particularly in connection with such harmonic mode crystals which employ thickness mode vibrations of the shear type, it will be understood that the harmonic crystal body $X_1$, $X_2$, or $X_3$ may be any suitable type of harmonic crystal body where the capacity $C_1$ across the crystal itself is preferably of reasonable low value. Since, in this circuit arrangement as shown by the drawing, the capacity of the crystal unit $X_1$, as measured from the control grid side 5 of the crystal unit $X_1$ to ground 2, does not tend to prevent the circuit from oscillating, the crystal body $X_1$ may be any suitable harmonic crystal body that has a reasonably low capacitance $C_1$ across the crystal body itself.

As illustrated in the drawing, the harmonic crystal body $X_1$, $X_2$, or $X_3$, etc., operates at one of its harmonic series resonance frequencies; and for operation at this series resonance frequency the harmonic crystal body $X_1$, $X_2$ or $X_3$, etc., may be connected in one arm of the bridge B thereby unbalancing the bridge B at such series resonance frequency and providing a feedback path between the plate electrode 8 and the control grid electrode 5 of the vacuum tube $V_1$, the circuit being traced as follows: from the plate electrode 8 of the vacuum tube $V_1$, sequentially, through the discriminator capacitor C, the tank circuit T, and the harmonic crystal body $X_1$, $X_2$, or $X_3$, etc., to the control grid electrode 5 of the vacuum tube $V_1$.

As illustrated in the drawing, a single oscillator tube $V_1$ may be utilized, with a resultant reduction in the magnitude of current drain upon the associated power supply sources 4 and 10, a feature which is of interest in portable or mobile or other isolated installations, where a low current drain may be desired or required.

Also as illustrated in the drawing, the cathode electrode 5 of the vacuum tube $V_1$ is there shown as being grounded at 2; and being so grounded, the use of the vacuum tube $V_1$ in the form of a pentode $V_1$ is thereby facilitated. Moreover, the use of the pentode $V_1$ results not only in an increase in the gain and the plate resistance for the vacuum tube $V_1$, but also in a decrease in the value of the grid-plate capacitance for the tube $V_1$ and hence a smaller effect from tube capacitance upon the desired frequency value of the oscillator circuit. Also, the use of the capacitance tap $C_4$ and $C_5$ on the harmonic crystal oscillator tank circuit T reduces the possibility of parasitic oscillations, since the vacuum tube $V_1$, and the stray capacitance associated therewith, is thereby parallel with the capacitors $C_4$ and $C_5$ and not with parts of the tank circuit inductance $L_1$. Accordingly, with the use of such a single pentode $V_1$ of relatively small interelectrode capacitance and having a grounded cathode electrode 1 connected to a tap 11 between the capacitance dividers $C_4$ and $C_5$, there is provided not only a resultant saving in the number of tubes used, but also the magnitude and number of undesired response frequencies may be reduced, and the possibility of obtaining oscillator operation on other than the correct frequency is reduced.

The neutralizing or balancing capacitor $C_2$ which, as shown in the drawing, is connected in the circuit between the control grid electrode 5 of the vacuum tube $V_1$ and the plate end 9 of the tank circuit T, may be made up to a capacitance value such that the total capacitance of capacitor $C_2$ plus the grid-to-plate interelectrode capacitance of the vacuum tube $V_1$ plus the stray capacitance associated therewith bears the same ratio to the stray capacitance $C_1$, across the harmonic crystal body, as the capacitance of capacitor $C_5$ bears to the capacitance of capacitor $C_4$. The stray capacitances in parallel with the neutralizing capacitor $C_2$ are usually quite small so that a real capacitor $C_2$ can be added to balance the circuit even when the voltage dividing capacitors $C_4$ and $C_5$ are chosen in the ratio for optimum oscillation of the circuit. Thus, the impedance of the tank circuit $L_1$, $C_3$, $C_4$, $C_5$ in the plate circuit 8 of the vacuum tube $V_1$ may be kept relatively high and that in the control grid circuit 5 thereof may be kept relatively low, thereby resulting in a maximum strength of oscillation and a decreased effect of the tube $V_1$ upon the desired oscillator frequency value.

In accordance with a feature of this invention, the discriminator capacitor C, added between the plate electrode 8 of the oscillator tube $V_1$ and the plate end 9 of the tuned circuit T, may be utilized to prevent oscillation as a grid-plate oscillator at the undesired fundamental mode frequency of the crystal body $X_1$, $X_2$, or $X_3$, while, at the same time, permitting oscillation as a grid-plate oscillator at the desired mechanical harmonic mode frequency thereof. For this purpose, the discriminator capacitor C may be made of a suitable impedance value to attenuate or in effect block the undesired lower frequency fundamental mode oscillation and, at the same time, transmit the desired higher frequency harmonic mode oscillation. Accordingly, the discriminator capacitor C may be designed to present a relatively high impedance at the undesired fundamental mode frequency of the crystal body or bodies $X_1$, $X_2$ and $X_3$, and thus effectively decouple the plate electrode 8 of the oscillator tube $V_1$ from the tuning circuit $L_1$, $C_3$, $C_4$ and $C_5$ at such undesired fundamental mode frequency or frequencies of the crystal bodies $X_1$, $X_2$, or $X_3$. But, at the desired operating or working frequency, which is the harmonic mode frequency of the harmonic crystal body $X_1$, $X_2$, or $X_3$, the discriminator capacitor C is designed to present a much lower impedance and thus effectively couple the plate electrode 8 of the oscillator tube $V_1$ to the tuning circuit $L_1$, $C_3$, $C_4$ and $C_5$ only at such desired harmonic mode frequency or frequencies of the crystal bodies $X_1$, $X_2$, or $X_3$.

While the discriminator capacitor C may be utilized to block or prevent fundamental frequency mode and simultaneously permit harmonic frequency mode oscillation in connection with only a single crystal body $X_1$, $X_2$, or $X_3$, such a discriminator capacitor C is also particularly advantageous when utilized in connection with a series or plurality of harmonic crystal bodies $X_1$, $X_2$ and $X_3$ operated at spaced different harmonic mode frequencies over a desired range of frequencies. Thus, where a wider range of harmonic mode operating frequencies, as provided by a series of such harmonic mode crystal bodies $X_1$, $X_2$, and $X_3$, may be desired, or where the required range of such operating frequencies may put the highest fundamental mode frequency of the series of crystal bodies $X_1$, $X_2$, and $X_3$ so close to the lowest harmonic mode frequency thereof as to preclude the use of other simple methods for maintaining adequate margins, then the method as here provided by the discriminator capacitor C may be utilized.

Accordingly, due to the method of using the capacitor C for preventing fundamental mode oscillations while simultaneously permitting harmonic mode oscillations, the circuit shown in the drawing utilizing a plurality of harmonic crystal bodies $X_1$, $X_2$, $X_3$, etc., for multifrequency channel operation, may be made to operate over a somewhat wider range of working harmonic mode frequencies. The tank circuit T, comprising the parallel connected inductance winding $L_1$ and capacitors $C_3$, $C_4$, and $C_5$ may be tuned to suit the harmonic mode frequencies within the range of such frequencies; and in order to obtain a wider tuning range, the tank circuit T may be tuned by adjustment of the variable capacitor $C_3$ component thereof, in preference to a tuning adjustment of the inductance of the winding $L_1$ for that purpose.

The desired harmonic mode frequency oscillations may be taken off from the output circuit having one terminal 12 thereof connected with the grounded cathode electrode 1 of the oscillator tube $V_1$, and the other terminal 13 thereof connected through a suitable coupling capacitor $C_{11}$ with the adjustable tap 14 provided on the coil $L_1$ which may be set at the proper point thereon for the purpose of properly matching the impedance of the output circuit to the impedance of the oscillator circuit.

It will be noted that the oscillators shown in Figs. 1 and 1A are adapted to operate directly at comparatively high harmonic mode crystal frequencies, without the use of an additional electrical harmonic or frequency multiplier means, as illustrated in Fig. 3. The frequency stability of these circuits is comparatively good in respect to frequency shift with changes in the voltage of the battery or power supply 10, with change of tubes $V_1$, and with changes in the tuning of the oscillator tank circuit $L_1$, $C_4$, $C_5$, $C_3$.

Fig. 3 shows an adaption of the circuit shown in Fig. 1 which may be similarly applied to Fig. 1A and used when a still higher output frequency is desired or required, than can be obtained directly from the harmonic mode frequencies of the crystal $X_1$ or $X_2$ or $X_3$ etc. As shown in Fig. 3, an additional parallel resonant circuit H consisting of a capacitor $C_6$ and an inductance coil $L_3$ tuned to an overtone electrical harmonic of the operating mechanical harmonic crystal frequency of the oscillator, is connected in series circuit relationship between the output or plate electrode 8 of vacuum tube $V_1$ and the discriminator capacitor C. The output of the desired electrical harmonic frequency may then be taken from the circuit by means of a small link coupling coil $L_4$ as shown in Fig. 3, or by other suitable means of couplings to the electrical harmonic tuned circuit H. It should be noted that the presence of tuned circuit H in the plate circuit of the oscillator tube $V_1$ does not affect the operation at the crystal harmonic oscillation frequency due to the fact that the impedance of tuned circuit H at a submultiple of its tuned electrical harmonic frequency will be very low.

While particular forms of output circuits have been illustrated in Figs. 1, 1A and 3, it will be understood that there are other ways in which output oscillations may be taken off and obtained.

Fig. 2, as already indicated, is a circuit diagram utilizing the same circuit as shown in Fig. 1, but illustrating more particularly at the left side of broken line *y—y*, the plurality of separate and different frequency harmonic mode crystals $X_1$, $X_2$, $X_3$, etc., adapted to be selectively connected, one at a time, into the associated arm of the bridge B of Figs. 1, 1A or 3, by means of suitable selective switches $Y_1$, $Y_2$, $Y_3$, etc., respectively, which may be selectively operated by remotely controlled selective relays $Z_1$, $Z_2$, $Z_3$, etc., respectively, thereby to provide multi-frequency oscillations in the oscillator circuit of Figs. 1, 1A or 3 at any one of a series of desired crystal controlled frequencies extending over a relatively narrow range of frequencies. It will be noted that, while in Fig. 2 the plurality of crystals is shown specifically as applied to one arm of the bridge B, as that of the circuit of Fig. 1, the crystal arrangement shown in Fig. 2 may be applied equally well in the same manner to the circuits shown in Figs. 1A and 3, or to other circuit arrangements which may be used.

As an illustrative example for a particular harmonic crystal oscillator circuit constructed in accordance with the circuit of Fig. 1A as provided with crystals shown more particularly by Fig. 2, and utilizing six such individual AT-cut harmonic mode crystals $X_1$, $X_2$, $X_3$, etc., operating separately at six different working thickness mode mechanical (5th) harmonic frequencies spaced at intervals over a range of frequencies of 300 kilocycles per second, which range may be placed anywhere within the range of frequencies extending from 25.7 to 39.7 megacycles per second, the vacuum tube $V_1$, may be a pentode known as the 403B or other suitable source of gain, the power supply source 10 may be a battery of about 65 volts direct-current potential or other suitable source of power supply, and the component circuit resistors, condensers, and inductance windings thereof may have values approximately as follows: inductance coil $L_F$ about microhenries, inductance winding $L_1$ about 0.7 microhenry, capacitor C about 10 micromicrofarads, stray capacitance $C_1$ about 10 micromicrofarads, capacitor $C_2$ about 1.5 micromicrofarads, capacitor $C_3$ about 7–50 micromicrofarads, capacitor $C_4$ about 75 micromicrofarads, capacitor $C_5$ about 18 micromicrofarads, capacitor $C_{10}$ about 500 micromicrofarads, capacitor $C_{11}$ about 10 micromicrofarads, resistor $R_g$ about 100,000 ohms and resistor $R_F$ about 1,000 ohms.

Although this invention has been described and illustrated in relation to specific arrangements, it it to be understood that it is capable of application in other organizations and is therefore not to be limited to the particular embodiments disclosed.

What is claimed is:

1. Harmonic crystal oscillator apparatus comprising an electronic gain source having input and output circuits, means including a bridge network coupling said input circuit with said output circuit, said coupling means including a connection to said bridge network forming a common return circuit for both said input and output circuits of said gain source, said bridge network including in one part thereof a series-resonant harmonic mode frequency piezo-electric crystal body which is disposed in circuit between said input and said output circuits, and said bridge network including directly therein as another and unitary component part thereof a single tuned tank circuit which is disposed in circuit between said crystal body and said output circuit, said tuned circuit being tuned substantially to said harmonic mode frequency of said crystal body, and means comprising a frequency discriminator capacitor disposed in circuit between said tuned circuit and said gain source output circuit and having a capacitance value sufficient for transmitting oscillations from said output circuit to said input circuit at said desired harmonic mode frequency of said crystal body while simultaneously attenuating and blocking oscillations sufficiently at the undesired fundamental mode frequency of said crystal body to substantially destroy oscillation of said apparatus at said undesired fundamental mode frequency.

2. Harmonic crystal oscillator apparatus comprising an electronic gain source having input and output circuits, a bridge network coupling said input circuit with said output circuit, said bridge network including a neutralizing capacitor disposed in one bridge arm thereof in circuit between said input and said output circuits, said bridge network including a series-resonant harmonic mode frequency piezoelectric crystal body disposed in another and adjacent crystal bridge arm thereof in circuit between said input and said output circuits, and said bridge network including a tuned tank circuit disposed across said last-mentioned adjacent bridge arms and disposed in circuit between said crystal body and said output circuit, said tuned circuit being tuned substantially to said harmonic mode frequency of said crystal body, said tuned circuit comprising an inductor directly connected in parallel with two remaining series-connected capacitance arms of said bridge network, a connection to the junction between said last-mentioned series-connected capacitance arms comprising means forming a common return circuit for both said input and said output circuits of said gain source, and means comprising a frequency discriminator capacitor disposed in circuit between said tuned circuit and said output circuit and having a capacitance value sufficient for transmitting oscillations from said output circuit to said input circuit at said desired harmonic mode frequency of said crystal body while simultaneously attenuating and blocking oscillations sufficiently at the undesired fundamental mode frequency of said crystal body to render said apparatus non-oscillatory at said fundamental mode frequency.

3. Harmonic crystal oscillator apparatus comprising an electronic gain source having an anode electrode, a control grid electrode and a cathode electrode, a bridge network connected with said anode, control grid and cathode electrodes, said bridge network having a plurality of bridge arms, a series-resonant harmonic mode frequency piezoelectric crystal body disposed in one of said bridge arms in circuit between said anode and control grid electrodes, and impedance elements disposed respectively in the remaining of said bridge arms, said remaining bridge arms comprising one arm disposed in circuit between said anode and control grid electrodes and two other adjacent bridge arms having a grounded tap connection therebetween connected directly with said cathode electrode, a tuned tank circuit including reactance means connected directly in shunt across said last-mentioned two other adjacent bridge arms, said tuned circuit being tuned substantially to said harmonic mode frequency of said crystal body and connected in circuit between said crystal body and said anode electrode of said gain source, and a frequency discriminator capacitor disposed in circuit between said anode electrode of said gain source and said tuned circuit, the capacitance value of said discriminator capacitor being of sufficiently high impedance at the undesired fundamental mode frequency of said crystal body to decouple said anode electrode from said tuned circuit at said fundamental mode frequency thereby constituting means for preventing circuit oscillations at said fundamental mode frequency of said crystal body, and said capacitance value being simultaneously of sufficiently low impedance at said desired operating harmonic mode frequency of said crystal body to couple said anode electrode to said tuned circuit at said harmonic mode frequency thereby constituting means for permitting circuit oscillations at said harmonic overtone mode frequency of said crystal body.

4. Harmonic crystal oscillator apparatus comprising an electronic gain source having an anode electrode, a control grid electrode and a grounded cathode electrode, a bridge network having bridge arms connected with said anode, control grid and grounded cathode electrodes, a series-resonant harmonic mode frequency piezoelectric crystal body disposed in one of said bridge arms and in circuit between said control grid electrode and said anode electrode, a condenser disposed in another of said bridge arms and in circuit between said control grid electrode and said anode electrode, capacitors disposed respectively in two other adjacent bridge arms having a grounded tap connection therebetween connected with said grounded cathode electrode, a tuned tank circuit comprising a parallel-connected inductor and condenser connected directly in shunt across said last-mentioned capacitors in said last-mentioned two other adjacent bridge arms, said tuned circuit being tuned substantially to said harmonic mode frequency of said crystal body, said tuned circuit having opposite ends comprising a control grid and connected in circuit with said control grid electrode through said crystal body and an anode end connected in circuit with said anode electrode, a frequency discriminator capacitor disposed in circuit between said anode electrode and said anode end of said tuned circuit, said discriminator capacitor having a capacitance value sufficient to constitute means for transmitting said harmonic mode frequency of said crystal body while simultaneously attenuating and blocking the undesired fundamental mode frequency thereof, and an output circuit for said harmonic mode frequency comprising connections leading to said cathode and said anode electrodes.

5. Apparatus in accordance with claim 4 wherein said discriminator capacitor is disposed outside of said bridge network.

6. Apparatus in accordance with claim 4 wherein said discriminator capacitor is disposed in said bridge network, and in said bridge arm between said condenser therein and said anode end of said tuned circuit.

7. Apparatus in accordance with claim 4 wherein said gain source is a single vacuum tube of the pentode type having cathode, anode, control grid, screen grid and suppressor grid electrodes.

8. Apparatus in accordance with claim 7 wherein said output circuit connections include a tap connection on said inductor of said tuned circuit.

9. Apparatus in accordance with claim 7 wherein said output circuit connections include tuned circuit means disposed in circuit between said anode electrode and said discriminator capacitor for producing an electrical harmonic overtone of said crystal harmonic mode frequency.

10. Apparatus in accordance with claim 7 wherein said crystal body is one of a plurality of harmonic mode frequency piezoelectric crystal bodies each having a desired different harmonic mode frequency spaced at intervals over a desired range of frequencies, and wherein means are provided for selectively and individually disposing each of said crystal bodies in said crystal bridge arm of said bridge network.

11. Harmonic crystal oscillator apparatus comprising an electronic gain source having input and output circuits, means including a four-arm bridge network coupling said input circuit with said output circuit of said gain source, said bridge network comprising three series-connected capacitance arms, a fourth arm including therein a series-resonant harmonic mode frequency piezoelectric crystal body and a tuning circuit which is tuned substantially to said harmonic mode frequency of said crystal body and connected directly across two diagonally opposite junctions of said four bridge arms, said gain source input circuit being connected directly across the other two diagonally opposite junctions of said four bridge arms, said gain source output circuit having connections to a pair of connection points across one only of said three capacitance arms that is contiguous to one end of said tuning circuit, one of said last-mentioned connections including therein between said one end of said tuning circuit and said gain source output a frequency discriminator capacitor having a capacitance value sufficient for transmitting oscillations from said output circuit to said input circuit at said desired harmonic mode frequency of said crystal body while simultaneously having a capacitance value sufficient for rendering said crystal oscillator apparatus substantially non-oscillatory at the undesired fundamental mode frequency of said crystal body.

12. Apparatus in accordance with claim 11 wherein said discriminator capacitor is disposed in another one of said three capacitance arms that is contiguous to said one end of said tuning circuit.

13. Harmonic crystal oscillator apparatus comprising a harmonic frequency piezoelectric crystal body, an amplifying device having anode, cathode and control electrodes, a single tank circuit consisting of an inductor, two series-connected capacitors connected across the two terminals of said inductor and an adjustable capacitor connected across said two terminals of said inductor and adjusted to tune said apparatus substantially to said harmonic frequency, a circuit connecting said cathode electrode to a junction point between said two series-connected capacitors, a circuit connecting said anode electrode to one of said two terminals of said inductor, a circuit connecting said control electrode to the other of said two terminals of said inductor and including in series therein said harmonic frequency piezoelectric crystal body, a neutralizing capacitor connection disposed between said control electrode and said circuit connecting said anode electrode to said one of said two terminals of said inductor, and adapted to feed back to said control electrode from said tank circuit sufficient energy to substantially neutralize energy fed through capacitance effects across said crystal body to said control electrode from said other of said two terminals of said inductor in said tank circuit, and a frequency discriminator capacitor located between said anode electrode and said tank circuit in said circuit connecting said anode electrode to said one of said two terminals of said inductor and having sufficient capacitive reactance value at the undesired fundamental frequency of said crystal body to substantially destroy oscillation of said apparatus at said fundamental frequency.

14. Apparatus in accordance with claim 13 wherein said discriminator capacitor is inserted between said anode electrode and said neutralizing capacitor connection.

15. Apparatus in accordance with claim 13 wherein said discriminator capacitor is inserted between said inductor and said neutralizing capacitor connection.

16. Apparatus in accordance with claim 13 wherein said circuit connecting said anode electrode to said inductor includes therein a resonant circuit tuned to a harmonic of said crystal harmonic frequency.

17. A harmonic crystal type oscillation generator comprising a single electronic discharge device having cathode, control grid, screen grid, suppressor grid and plate electrodes, said cathode electrode being grounded, a grid leak resistor connected in circuit between said control grid and grounded cathode electrodes, a by-pass capacitor connected in circuit between said screen grid and grounded cathode electrodes, means for supplying positive potentials respectively to said plate electrode through a choke coil and to said screen grid electrode through a resistor, a four-arm bridge connected with said plate, control grid and grounded cathode electrodes, said bridge having a capacitor disposed in a first arm, a capacitor disposed in a second and adjacent arm, a harmonic piezoelectric crystal body disposed in a third arm adjacent said second arm and a pair of series connected capacitors disposed in a fourth arm thereof, tuned circuit means including a parallel connected capacitor and inductance winding having the opposite ends thereof connected directly across said bridge circuit between a connection point intermediate said second and third bridge arms and a connection point intermediate said first and fourth bridge arms for tuning said bridge circuit with respect to an overtone harmonic mode frequency of said crystal body, said inductance winding having a tap connection provided thereon, a grounded connection point disposed intermediate said first and second bridge arms and connected with said grounded cathode electrode, a connection point disposed intermediate said third and fourth bridge arms and connected with said control grid electrode, a connection point disposed intermediate said series connected capacitors in said fourth bridge arm and connected with said plate electrode, said capacitor disposed in said fourth bridge arm and connected in circuit between said connection point therein leading to said plate electrode and said connection point between said first and fourth bridge arms, having a predetermined frequency discriminator capacitance value, said value being of sufficiently high impedance at the fundamental mode frequency of said crystal body to decouple said plate electrode from said tuned circuit at said fundamental mode frequency thereby constituting means for preventing circuit oscillations at said fundamental mode frequency of said crystal body, and said value being simultaneously of sufficiently low impedance at said desired operating harmonic mode frequency of said crystal body to couple said plate electrode to said tuned circuit at said harmonic mode frequency thereby constituting means for permitting circuit oscillations at said harmonic overtone mode frequency of said crystal body, and an output circuit for said harmonic frequency oscillations comprising a connection with said grounded cathode electrode and a connection with said tap connection provided on said inductance winding of said tuned circuit.

References Cited in the file of this patent

UNITED STATES PATENTS

| Number | Name | Date |
|---|---|---|
| 2,260,707 | Fair | Oct. 21, 1941 |